United States Patent
Masuda et al.

(10) Patent No.: US 7,220,714 B2
(45) Date of Patent: May 22, 2007

(54) PROCESS AND COMPOSITION FOR REMOVING RESIDUES FROM THE MICROSTRUCTURE OF AN OBJECT

(75) Inventors: Kaoru Masuda, Kobe (JP); Katsuyuki Iijima, Kobe (JP); Tetsuya Yoshikawa, Takasago (JP); Darry W. Peters, Stewartsville, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 191 days.

(21) Appl. No.: 10/822,804

(22) Filed: Apr. 13, 2004

(65) Prior Publication Data

US 2004/0192572 A1     Sep. 30, 2004

Related U.S. Application Data

(62) Division of application No. 10/152,782, filed on May 23, 2002, now abandoned.

(51) Int. Cl.
    *C11D 7/50*    (2006.01)
(52) U.S. Cl. ................... 510/175; 510/176; 134/1.3
(58) Field of Classification Search ............... None
    See application file for complete search history.

(56) References Cited

U.S. PATENT DOCUMENTS

| | | | |
|---|---|---|---|
| 4,882,765 A | 11/1989 | Maxwell et al. | |
| 5,339,844 A | 8/1994 | Stanford, Jr. et al. | |
| 5,456,759 A | 10/1995 | Stanford, Jr. et al. | |
| 5,783,082 A | 7/1998 | DeSimone et al. | |
| 5,866,005 A * | 2/1999 | DeSimone et al. | 210/634 |
| 5,868,856 A | 2/1999 | Douglas et al. | |
| 5,868,862 A | 2/1999 | Douglas et al. | |
| 5,873,948 A | 2/1999 | Kim | |
| 5,908,510 A | 6/1999 | McCullough et al. | |
| 5,976,264 A | 11/1999 | McCullough et al. | |
| 5,983,082 A | 11/1999 | Hilbert | |
| 6,149,828 A * | 11/2000 | Vaartstra | 216/57 |
| 6,242,165 B1 | 6/2001 | Vaartstra | |
| 6,277,753 B1 | 8/2001 | Mullee et al. | |
| 6,306,564 B1 | 10/2001 | Mullee | |

(Continued)

FOREIGN PATENT DOCUMENTS

JP         60-92333        3/1984

(Continued)

OTHER PUBLICATIONS

European Search Report No. 04010688.2-1221 dated Jun. 23, 2004.

(Continued)

*Primary Examiner*—Gregory Webb
(74) *Attorney, Agent, or Firm*—Reed Smith LLP; Stanley P. Fisher, Esq.; Juan Carlos A. Marquez, Esq.

(57) ABSTRACT

A process for removing residues from the microstructure of an object is provided, which comprises steps of preparing a remover including carbon dioxide, an additive for removing the residues and a co-solvent dissolving the additive in said carbon dioxide at a pressurized fluid condition; and bringing the object into contact with the remover so as to remove the residues from the object. A composition for removing residues from the microstructure of an object is also provided.

5 Claims, 1 Drawing Sheet

U.S. PATENT DOCUMENTS

| | | |
|---|---|---|
| 6,425,956 B1 | 7/2002 | Cotte et al. |
| 6,499,322 B1 | 12/2002 | DeYoung et al. |
| 6,558,475 B1 * | 5/2003 | Jur et al. ...................... 134/21 |
| 2002/0086537 A1 | 7/2002 | Mullee et al. |
| 2002/0148492 A1 | 10/2002 | Yamagata et al. |
| 2002/0164873 A1 * | 11/2002 | Masuda et al. ............. 438/689 |
| 2003/0106573 A1 | 6/2003 | Masuda et al. |

FOREIGN PATENT DOCUMENTS

| | | |
|---|---|---|
| JP | 63-79530 | 1/1987 |
| JP | 1-170026 | 12/1987 |
| JP | 2-209729 | 2/1989 |
| JP | 8-191063 | 6/1995 |
| JP | 9-043857 | 7/1995 |
| JP | 10-125644 | 10/1997 |
| JP | 11-204491 | 1/1998 |
| JP | 2001-038101 | 7/1999 |
| WO | WO 98-16288 | 10/1997 |
| WO | WO 00/74306 A2 | 5/2000 |
| WO | WO 01/22755 A1 | 9/2000 |
| WO | WO 01-33613 A2 | 11/2000 |
| WO | WO 01/33613 A2 | 5/2001 |
| WO | WO 02/15251 A1 | 2/2002 |
| WO | WO 02-080233 A2 | 2/2002 |
| WO | WO 02/080233 A2 | 10/2002 |

OTHER PUBLICATIONS

European Search Report dated Jul. 29, 2003.

* cited by examiner

PROCESS AND COMPOSITION FOR REMOVING RESIDUES FROM THE MICROSTRUCTURE OF AN OBJECT

This application is a Divisional of nonprovisional U.S. application Ser. No. 10/152,782 now abandoned. Priority is claimed based on U.S. application Ser. No. 10/152,782 filed May 23, 2002.

BACKGROUND OF THE INVENTION

1. Field of the Invention

The present invention relates to a process and a composition for removing residues from the microstructure of an object. The present invention specifically relates to a process and a composition for removing residues such as resists, generated during a semiconductor manufacturing process from a semiconductor wafer surface having a fine structure of convex and concave portions.

2. Description of the Related Art

It is required as one step in manufacturing a semiconductor wafer to remove residues, such as photoresists, UV-hardened resists, X-ray hardened resists, ashed resists, carbon-fluorine containing polymer, plasma etch residues, and organic or inorganic contaminants from the other steps of the manufacturing process. The dry and wet removal methods are commonly used. In the wet removal method, the semiconductor wafer is dipped in an agent, such as a water solution, including a remover to remove residues from the surface of semiconductor wafer.

Recently, super critical carbon dioxide is used as such an agent because of its low viscosity and high diffusivity. According to such properties, cleaning with super critical carbon dioxide provide several advances in the treatment of microstructures, such as high penetration into small areas between microstructures and successfully drying microstructures because of non liquid-liquid interface in the super critical phase.

However, super critical carbon dioxide is not enough by itself to remove several residues from the surface of the semiconductor wafer. To resolve this problem, several additives to super critical carbon dioxide are proposed. As described in the Japanese unexamined patent publication No. 10-125644, methane or surfactant having CFx group is used as an additive to super critical carbon dioxide. In Japanese unexamined patent publication No. 8-191063, dimethylsulfoxide or dimethyl-formamide is used as such an additive. However, based on the inventors' studies, these additives are not always effective for removing residues. Especially, when the cleaning object is like a wafer which consist of low dielectric constant materials, the quality of such wafer decreased after treatments by such process using alkaline compounds and water. This might be occurred because basic compounds and water caused damages on low dielectric constant materials, especially on materials having dielectric constant lower than 4. (hereinafter referred to as low-k materials) Thus, the present invention is objected to provide a novel and effective cleaning without significant damage to the low-k materials.

SUMMARY OF THE INVENTION

An object of the present invention is, therefore, to provide a process and a composition for effectively removing residues from the microstructure of an object without significant damages to the low-k materials.

According to the present invention, a process is provided for removing residues from the object which comprises steps of preparing a remover including carbon dioxide, an additive for removing the residues, an Inhibitor for protecting low-k damage and a co-solvent for dissolving said additive in said carbon dioxide at a pressurized fluid condition, and bringing the object into contact with said remover so as to remove the residues from the object A composition is further provided for removing residue from the object, which comprises carbon dioxide a fluoride containing additive, a co-solvent or mixture of co-solvents capable of dissolving the fluoride containing additive, and an inhibitor.

BRIEF DESCRIPTION OF THE DRAWINGS

The foregoing and additional features and characteristics of the present invention will become more apparent from the following detailed description considered with reference to the accompanying drawings in which like reference numerals designate like elements and wherein.

DESCRIPTION OF THE PREFERRED EMBODIMENTS

Figure 1:
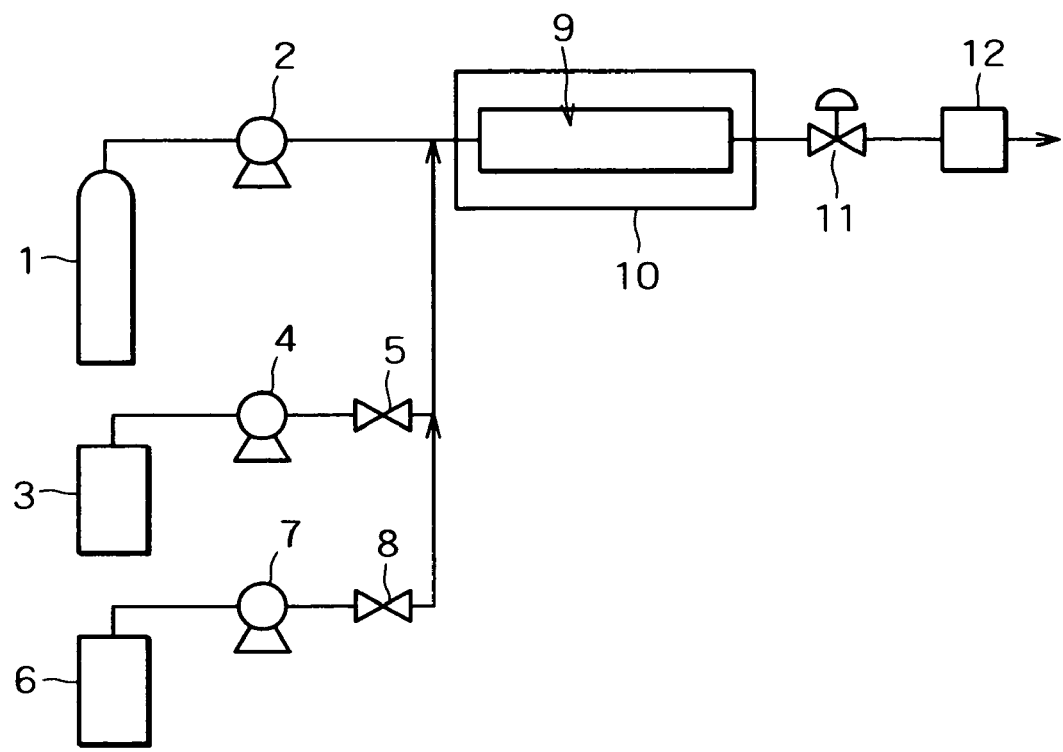
FIG. 1 is a schematic diagram of an apparatus for removing residues in accordance with the present invention.

The present invention is applied to the microstructure of an object, e.g., a semiconductor wafer having a fine struggle of convex and concave portions on its surface, and a substrate made of a metal, plastic or ceramic which forms or retains continuous or non-continuous layer of materials different therefrom.

First, said remover used in this invention is described. It includes carbon dioxide, an additive for removing the residues, an inhibitor for suppressing residues and a co-solvent for dissolving said additive and said inhibitor in said carbon dioxide at a pressurized fluid condition.

The pressurized carbon dioxide has a high dispersion rate and enables the dissolved residues to disperse therein. If carbon dioxide is converted to a super critical condition, it penetrates into fine pattern portions of the object more effectively. By this feature, the additive is conveyed into pores or concave portions on a surface of the object due to the low viscosity of carbon dioxide. The carbon dioxide is pressurized to 5 MPa or more, but not less than 7.1 MPa at a temperature of 31° C. to convert the carbon dioxide to a super critical fluid condition.

Although any additives that can remove residues from microstructures could be used, it is preferred in the present invention to use quaternaryammoniumfluorides because of their effective cleaning ability. The preferred fluoride compounds includes at least one element selected from the group consisting of tetramethylammoniumfluoride, tetraethylammoniumfluoride, tetrapropylammoniumfluoride, tetrabutylammoniumfluoride, cholinefluoride. Among these compounds, tetramethylammoniumfluoride (TMAF) is the most preferable one.

If the concentration of the additive is too low, cleaning of residues is not sufficient The lower limit of the additive is 0.1001 wt. %, preferably 0.005 wt. %, and more preferably 0.01 wt. %. However, when the concentration is more than 0.1 wt. %, low-k materials are damaged because of excessive etching of low-k materials. Thus, the upper range of the additive is 0.1 wt. %, preferably 0.05 wt. %, and more preferably 0.03 wt. %.

The remover in the present invention also includes polyhydric alcohol. Polyhydric alcohol act as an inhibitor that protects the low-k materials from the significant damage from the additives such as fluorides. During inventors' studies, after some cleaning tests of microstructures containing of low-k films, there were some liquid-like residues. These 'liquid like residues' were recognized as byproducts originated from etching reactions between some of the compounds in the remover and a part of low-k materials.

Such byproducts could not be removed and appeared as liquid-like residues because such products from low-k materials were not easily dissolved into super critical carbon dioxide.

By further investigations, it was found that the amount of such liquid-like residues could be reduced when polyhydric alcohols were used as a component of said remover. Therefore, the present invention, the remover includes polyhydric alcohols as an inhibitor to protect low-k materials from the damage. Although the mechanism of the protection of low-k by polyhydric alcohol is still under investigations, polyhydric alcohol might adsorb on the surface of the low-k materials and protect the surface from the attack of the chemicals.

Polyhydric alcohols may be dihydric alcohol such as ethyleneglycol, propyleneglycol, trimethyleneglycol, diethyleneglycol, dipropyleneglycol, 1,2-, 1,3-, 1,4- or 2,3-butanediol, pentamethyleneglycol, hexyleneglycol, octyleneglycol or trihydric alcohols such as glycerin, trimethylolpropanae, 1,2,6-hexanetriol, and tetrahydric alcohols such as pentaelythritol. Also, polyethyleneglycol or polypropyleneglycol may be used. Among these compounds, dihydric alcohols are preferable and ethyleneglycol and propyleneglycol are more preferable.

If the concentration of the polyhydric alcohols is too low, the protection of the low-k is not sufficient and amount of liquid-like residues increases. The lower range of the polyhydric alcohols is 0.005 wt. %, preferably 0.007 wt. %, and more preferably 0.01 wt. %. However, when the concentration is higher than 0.1 wt. %, the efficiency of the protection is saturated. Thus, the upper range of the polyhydric alcohols is 0.1 wt. %, preferably 0.07 wt. %, and more preferably 0.05 wt. %.

As the pressurized carbon dioxide Is not enough by itself to dissolve additives and inhibitors such as TMAF and polyhydric alcohols, the present invention uses co-solvent to dissolve them into carbon dioxide. The co-solvent of the present invention is a compound having an affinity to both carbon dioxide and the additive. Such a co-solvent dissolves or disperses the additive homogeneously in the pressurized carbon dioxide in fluid condition. Although any co-solvent is used if it can make additives and polyhydric alcohols soluble into pressurized carbon dioxide,alcohols are preferable. The alcohol may be any alcohol, e.g. ethanol, methanol, n propanol, iso-propanol, n-butanol, iso-butanol, diethyleneglycolmonomethyleter, diethyleneglycolmonomethyleter, and hexafluoro isopropanol. Among these alcohols, methanol, ethanol and iso-propanol are preferable because they act as a good co-solvent to wide range of compounds.

The kind and amount of the co-solvent are selected depending on the kind and amount of the additive to carbon dioxide. The amount of the co-solvent is preferably five times or more than that of the additive because the remover easily becomes homogeneous and transparent. Alternatively, the remover may include the co-solvent in a range of 1 wt. % to 50 wt. %. If more than 50 wt. % of the co-solvent is added, the penetration rate of the remover decreases due to less amount of carbon dioxide. It is preferable to use a remover including carbon dioxide, alcohol as the co-solvent, quaternary ammonium fluoride and/or quaternary ammonium hydroxide as the additive because these additives are well dissolved in carbon dioxide by alcohol and are $CO_2$ philic.

When TMAF is used as an additive, TMAF should be initially dissolved into said co-solvent because TMAF is a sold at ambient temperature. At this time, solvents such as dimethylacetamide (DMAC) or de-ionized water (DIW) could be added to help TMAF to be dissolved into carbon dioxide more easily. The amount of such solvents is preferably less than 20 times of TMAF. Especially, a concentration of DIW should be minimized because of the damages to the low-k materials.

The practical procedure will be described using drawings. In the below description, components of remover other than carbon dioxide, a mixture of additives, inhibitors, co-solvents is simply called 'cleaning reagents'. FIG. 1 shows a simplified schematic drawing of an apparatus use for removing residues according to the present invention. In the FIG. 1 is a carbon dioxide cylinder, 2 is a high pressure pump for carbon dioxide, 3 is a storage tank of cleaning reagents, 4 is a pump for cleaning reagents, 5 is a valve, 6 is a storage tank for rinse reagents, 7 is a pump for rinse reagents, 8 is a valve, 9 is a high pressure vessel, and 10 is a thermostat. Firstly, the microstructures, for example, semiconductor wafer having residues on its surface is introduced to and placed in a high pressure vessel 9, then carbon dioxide is supplied from a carbon dioxide cylinder 1 to the high pressure vessel 9 by a high pressure pump 2. The high pressure vessel 9 is thermostated at a specific temperature by a thermostat 10 in order to maintain the pressurized carbon dioxide in the high pressure vessel 9 at the super critical condition. High pressure vessel 9 can be replaced by that having heating unit. Cleaning reagents are supplied to the high pressure vessel 9 from tanks 3 by high pressure pumps 4. Cleaning stop starts at the time when the cleaning reagents are fed from tank 3 to the high pressure vessel 9. The feed of the carbon dioxide and cleaning reagents may be continuous or batch-like.

The removing process is performed at a temperature in the range from 31° C. to 120° C., and at a pressure ranged from 5 MPa to 30 M Pa, preferably, from 7.1 M Pa to 20 M Pa. The time required for removing the residues depends on the size of the object, the kind and amount of the residues, which is usually in the range from a minute to several ten minutes.

After a cleaning step, a rinse step follows. Residues removed from surface during the cleaning step remains in the vessel 9 after the cleaning step finishes. If pure carbon dioxide is fed into such conditions, some portion of residues will deposit on the surface of the objects. Therefore, after the cleaning step, the first rinse step with the mixture of carbon dioxide and rinse agents is applied. After this first rinse step, the second rinse step with pure carbon dioxide is applied.

Preferable rinse agents used in the first rinse step arc those that can remove liquid-like residues. After inventors' investigations, compounds having specific dielectric constant similar to water are effective for this purpose. Since the specific dielectric constant of water is 78 at 25° C. under atmospheric pressure, compounds having specific dielectric constant not smaller than 78 are used. The reason why the required specific dielectric constants are similar to that of water is that the liquid-like residues as by products of low-k etching have high polarity, resulting in the high affinity to the polar solvents.

On the other hand, polyhydric alcohols are required in the present invention as described in the previous section. However, if the amount of the cleaning reagents is small enough to suppress the by-production due to damages of low-k materials, rinse agent having specific dielectric constant not smaller than 78 may be used with a relative longer treatment time without any addition of polyhydric alcohols in the cleaning step. However, in order to minimize the process time of the first rinse step (for example, 5 min. or less), it is preferable to minimize the by-production of liquid-like residues with addition of polyhydric alcohols.

Practically, the first rinse step can he done by stopping the feed of the cleaning reagents by the valve 5, followed by feed of carbon dioxide and rinse reagents to the high pressure vessel 9 to get rid of the contents of vessel 9. A flow meter 12 may be used to control the now rate. During the first rinse step, it is preferable to decrease the feed rate of rinse reagents gradually or in step wise manner with valve 8 to replace the contents by pure carbon dioxide, followed by the second rinse step with pure carbon dioxide.

Fluid evacuated from the cleaning step and the first rinse step can be recycled and re-used by the separation into gaseous carbon dioxide and liquid fractions by a carbon dioxide recycle process, for example, including a liquid gas separator.

After the second rinse step, by releasing pressure with a pressure control valve 11, carbon dioxide vaporize to gaseous phase. Therefore, microstructures such as semiconductor wafers can be dried without any water mark and any destructions of the pattern.

Hereinafter, the present invention is described with reference to experiments. Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

EXAMPLES

Example 1

At first, in order to investigate the degree of the damage of cleaning reagent to the low-k materials, etch rate measurements of low-k films were carried out. Low-k films were prepared on the silicon wafer by coating the materials consisting of organic silicon followed by heating and drying. The film thickness of the low-k films was about 500 Å and k-value was in the range of 2 to 3. Using cleaning tools shown in the FIG. 1, a wafer coated by the low-k film was set into the high pressure vessel 9. After closing the cover of the vessel 9, carbon dioxide was introduced from carbon dioxide cylinder 1 through the pump 2. The temperature of the vessel 9 was maintained at 50° C. with a thermostat 10 and the pressure was controlled by the control valve 11. After the pressure reached 15 MPa, cleaning reagents were fed into tho vessel 9 from the storage tank 4 through the pump 4. After a 10 minute-treatment, 5 minutes of the first rinse step was applied, followed by 10 minutes of the second rinse stop with a pure carbon dioxide. A rinse reagent used in the first rinse step was 0.5 wt. % of de-ionized water, 4.5 wt. % of ethanol and 95 wt. % of carbon dioxide.

After the second rinse step, the pressure was released by the pressure control valve 11 and wafer was taken to be provided for further evaluation. Etch rates (Å/min) were calculated by the difference in the film thickness before and after the treatment divided by the 10 min. Film thickness was measured by an optical measurement tool. The results are shown in table 1.

The abbreviation used in table 1 are follows;
TMAF:Tetramethyl ammonium fluoride, DMAC:Dimethylacetamide, DIW:de-ionized water, EG:Ethyleneglycol, PG:Propyleneglycol, EtOH:Ethanol

TABLE 1

| | | Componets of remover | | | | | | Etch rate Å/min |
|---|---|---|---|---|---|---|---|---|
| | | Additive and inhibitor | | | Co-solvent | Additional solvents | | |
| Run | $CO_2$ | TMAF | EG | PG | EtOH | DMAC | DIW | |
| 1 | 95 | 0.013 | 0 | 0 | 4.9 | 0.063 | 0.024 | 240 |
| 2 | 95 | 0.013 | 0.012 | 0 | 4.9 | 0.051 | 0.024 | 230 |
| 3 | 95 | 0.013 | 0 | 0.012 | 4.9 | 0.063 | 0.024 | 155 |
| 4 | 95 | 0.013 | 0 | 0.024 | 4.9 | 0.051 | 0.024 | 148 |
| 5 | 95 | 0.005 | 0 | 0 | 5.1 | 0.066 | 0 | 53 |
| 6 | 95 | 0.005 | 0 | 0.012 | 4.9 | 0.054 | 0 | 19 |
| 7 | 95 | 0.013 | 0 | 0 | 4.8 | 0.165 | 0 | 91 |
| 8 | 95 | 0.013 | 0 | 0.03 | 4.8 | 0.135 | 0 | 67 |

Example 2

In the same manner described in the example 1, wafers coated by the low-k film were prepared. After line and space patterns (180 nm width) were processed by the lithography on the surface, ordinary etching by fluorocarbon gases and ashing by oxygen plasma. After one minute cleaning with cleaning reagents listed in (the table 2 under the same condition as the example 1, five minute or ten minute of the first rinse step using components listed in table 2, followed by ten minutes of the second rinse step with a pure carbon dioxide. The first rinse reagents used were 0.5 wt. % of listed component; 4.5 wt. % of ethanol and 95 wt. % of carbon dioxide. After the release of the pressure by opening the pressure control valve 11, the treated wafer was taken and provided for the evaluation. The cleaning performance was evaluated by the observation of a scanning electron microscope (SEM) with amplitude of 50000. The performance was checked both residues on the surface of the line and the liquid-like residues. The criteria used for investigation was as follows;

Excellent: No residues remained

Good: Amount of residues was less than 1 area % on the patterned side of the wafer.

NG (Not good): Amount of residues was more than 1 area %.

The abbreviation used in table 2 are follows;
TMAF:Tetramethyl ammonium fluoride, DMAC:Dimethylacetamide, $H_2O$:water ($\in$=78), DIW:de-ionized water, EG:Ethyleneglycol, PG:Propyleneglycol, EtOH:Ethanol, FA:Formamide ($\in$=111), MF:Methylformamide ($\in$=182), DMF:Dimethylformamide ($\in$=36.7), MeOH:Methanol ($\in$=42), AC:Acetone ($\in$=21)

According to the cleaning process described in the present invention, low-k materials that are easily damaged by the cleaning reagents could be protected by the use of the cleaning reagents including inhibitors such as polyhydric alcohols added into carbon dioxide. Besides, residues produced because of the damages of low-k materials by the cleaning reagents could be removed by a suitable selection of the rinse reagents. Therefore, the cleaning process described in the present invention provide one of the optimized cleaning processes applicable to the microstructure such as semiconductor wafers.

TABLE 2

| | | Components of remover | | | | | | | 1 min cleaning + 5 min 1st rinse | | 1 min cleaning + 10 min 1st rinse | |
|---|---|---|---|---|---|---|---|---|---|---|---|---|
| | | Additive and Inhibitor | | | Co-solvent | Additional solvents | | | | | | |
| Run | $CO_2$ | TMAF | EG | PG | EtOH | DMAC | DIW | Rinse | liquid-like | polymer | liquid-like | polymer |
| 1 | 95 | 0.013 | 0 | 0 | 4.9 | 0.063 | 0.024 | DMF | NG | Excellent | NG | Excellent |
| 2 | 95 | 0.013 | 0 | 0 | 4.9 | 0.063 | 0.024 | MeOH | NG | Excellent | NG | Excellent |
| 3 | 95 | 0.013 | 0 | 0 | 4.9 | 0.063 | 0.024 | AC | NG | Excellent | NG | Excellent |
| 4 | 95 | 0.013 | 0 | 0 | 4.9 | 0.063 | 0.024 | $H_2O$ | NG | Excellent | Excellent | Excellent |
| 5 | 95 | 0.013 | 0 | 0 | 4.9 | 0.063 | 0.024 | FA | Excellent | Excellent | Excellent | Excellent |
| 6 | 95 | 0.013 | 0 | 0 | 4.9 | 0.063 | 0.024 | MF | Excellent | Excellent | Excellent | Excellent |
| 7 | 95 | 0.013 | 0.012 | 0 | 4.9 | 0.051 | 0.024 | $H_2O$ | NG | Excellent | Excellent | Excellent |
| 8 | 95 | 0.013 | 0 | 0.012 | 4.9 | 0.063 | 0.024 | $H_2O$ | Good | Excellent | Excellent | Excellent |
| 9 | 95 | 0.013 | 0 | 0.012 | 4.9 | 0.063 | 0.024 | FA | Excellent | Excellent | Excellent | Excellent |
| 10 | 95 | 0.013 | 0 | 0.024 | 4.9 | 0.051 | 0.024 | $H_2O$ | Excellent | Excellent | Excellent | Excellent |
| 11 | 95 | 0.005 | 0 | 0 | 5.1 | 0.066 | 0 | $H_2O$ | Good | Good | Excellent | Good |
| 12 | 95 | 0.005 | 0 | 0.012 | 4.9 | 0.054 | 0 | $H_2O$ | Excellent | Good | Excellent | Good |
| 13 | 95 | 0.013 | 0 | 0 | 4.8 | 0.165 | 0 | $H_2O$ | Good | Excellent | Excellent | Excellent |
| 14 | 95 | 0.013 | 0 | 0 | 4.8 | 0.165 | 0 | FA | Excellent | Excellent | Excellent | Excellent |
| 15 | 95 | 0.013 | 0 | 0.03 | 4.8 | 0.135 | 0 | $H_2O$ | Excellent | Excellent | Excellent | Excellent |

What is claimed is:

1. A composition for removing residues from the microstructure of an object comprising:
   carbon dioxide;
   an additive for removing the residues;
   an inhibitor for suppressing residues; and
   a co-solvent for dissolving said additive and said inhibitor in said carbon dioxide at a pressurized fluid condition,
   wherein the inhibitor comprises a polyhydric alcohol,
   wherein polyhydric alcohol is a dihydric alcohol,
   wherein the dihydric alcohol is selected from ethylene glycol, propylene glycol, trimethyleneglycol, diethyleneglycol, dipropyleneglycol, 1,2-butanediol, 1,2-butanediol, 1,4-butanediol, 2,3-butanediol, pentamethyleneglycol, hexyleneglycol, octyleneglycol, and mixtures thereof, and
   wherein the dihydric alcohol comprises propylene glycol.

2. A composition for removing residues from the microstructure of an object comprising:
   carbon dioxide;
   an additive for removing the residues;
   an inhibitor for suppressing residues; and
   a co-solvent for dissolving said additive and said inhibitor in said carbon dioxide at a pressurized fluid condition,
   wherein the co-solvent is the solvent, and wherein the solvent is dimethylacetamide.

3. A composition for removing residues from the microstructure of an object comprising:
   carbon dioxide;
   an additive for removing the residues;
   an inhibitor for suppressing residues; and
   a co-solvent for dissolving said additive and said inhibitor in said carbon dioxide at a pressurized fluid condition,
   wherein the additive comprises a quaternaryammoniumfluorides, and
   wherein the co-solvent is the mixture of co-solvents ethanol and dimethylacetamide.

4. A composition for removing residue from the microstructure of an object, comprising: carbon dioxide, a fluoride containing additive, a co-solvent or mixture of co-solvents capable of dissolving the fluoride containing additive, and an inhibitor comprising a polyhydric alcohol,
   wherein the polyhydric alcohol comprises propylene glycol.

5. A composition for removing residue from the microstructure of an object, comprising: carbon dioxide, tetramethylammoniumfluoride, ethanol, dimethylacetamide, and propylene glycol.

* * * * *

UNITED STATES PATENT AND TRADEMARK OFFICE
CERTIFICATE OF CORRECTION

| | | |
|---|---|---|
| PATENT NO. | : 7,220,714 B2 | Page 1 of 1 |
| APPLICATION NO. | : 10/822804 | |
| DATED | : May 22, 2007 | |
| INVENTOR(S) | : Kaoru Masuda et al. | |

It is certified that error appears in the above-identified patent and that said Letters Patent is hereby corrected as shown below:

Column 8, Line 32

In claim 3 delete the word "quaternaryammoniumfluorides" and insert the word -- quaternaryammoniumfluoride --

Signed and Sealed this

Third Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,220,714 B2 | Page 1 of 1 |
| APPLICATION NO. | : 10/822804 | |
| DATED | : May 22, 2007 | |
| INVENTOR(S) | : Kaoru Masuda et al. | |

It is certified that error appears in the above-identified patent and that said Letters Patent is hereby corrected as shown below:

Title Page; (75) Inventors

Delete the 4th named inventor "Darry" and insert -- Darryl --

Signed and Sealed this

Thirteenth Day of November, 2007

JON W. DUDAS
*Director of the United States Patent and Trademark Office*